US011263978B2

(12) United States Patent
Jo et al.

(10) Patent No.: US 11,263,978 B2
(45) Date of Patent: Mar. 1, 2022

(54) DISPLAY DEVICE

(71) Applicant: LG Display Co., Ltd., Seoul (KR)

(72) Inventors: Boeun Jo, Paju-si (KR); Sangho Kim, Paju-si (KR); Taekyoung Kim, Paju-si (KR)

(73) Assignee: LG Display Co., Ltd., Seoul (KR)

( * ) Notice: Subject to any disclaimer, the term of this patent is extended or adjusted under 35 U.S.C. 154(b) by 0 days.

(21) Appl. No.: 16/583,030

(22) Filed: Sep. 25, 2019

(65) Prior Publication Data

US 2020/0105206 A1 Apr. 2, 2020

(30) Foreign Application Priority Data

Sep. 28, 2018 (KR) ........................ 10-2018-0116127

(51) Int. Cl.
*G09G 3/3291* (2016.01)
*G09G 3/3258* (2016.01)
*H01L 27/32* (2006.01)

(52) U.S. Cl.
CPC ......... *G09G 3/3291* (2013.01); *G09G 3/3258* (2013.01); *H01L 27/3276* (2013.01)

(58) Field of Classification Search
CPC .. G09G 3/3291; G09G 3/3258; G09G 3/3225; G09G 2300/04; H01L 27/3276; H01L 51/0097; H01L 2251/5338; H01L 27/3223; H01L 27/3244; G09F 9/301
See application file for complete search history.

(56) References Cited

U.S. PATENT DOCUMENTS

| 2004/0084740 | A1* | 5/2004 | Hayashi | G02F 1/13452 257/432 |
| 2006/0001792 | A1* | 1/2006 | Choi | H01L 27/3223 349/54 |
| 2009/0276546 | A1* | 11/2009 | Lui | G06F 13/4072 710/16 |
| 2013/0002527 | A1* | 1/2013 | Kim | H01L 27/3272 345/82 |
| 2013/0106817 | A1* | 5/2013 | Gang | G02F 1/061 345/211 |
| 2017/0358641 | A1* | 12/2017 | Park | H01L 27/3276 |
| 2018/0211982 | A1* | 7/2018 | Wang | G02F 1/136286 |
| 2018/0342572 | A1* | 11/2018 | Park | H01L 27/124 |

FOREIGN PATENT DOCUMENTS

EP 1 610 389 A2 12/2005

* cited by examiner

*Primary Examiner* — Carolyn R Edwards
(74) *Attorney, Agent, or Firm* — Seed IP Law Group LLP

(57) ABSTRACT

A display device comprises a substrate, a data link line, a power link line, and a dummy pattern. The substrate includes a display area in which pixels are arranged and a non-display area outside the display area. The data link line is positioned in the non-display area to deliver a predetermined signal to the pixels. The power link line is spaced apart from the data link line at a predetermined distance in the non-display area and delivers a predetermined power to the pixels. The dummy pattern is positioned between the data link line and the power link line in the non-display area.

13 Claims, 12 Drawing Sheets

DISPLAY DEVICE

CROSS-REFERENCE TO RELATED APPLICATION(S)

This application claims the priority benefit of Korean Patent Application No. 10-2018-0116127, filed Sep. 28, 2018, which is incorporated herein by reference for all purposes as if fully set forth herein.

BACKGROUND

Technical Field

The present disclosure relates to a display device having a bending area.

Description of the Related Art

As the information technology is developed, the market of a display device, that is, a connection medium between a user and information, grows larger. Accordingly, the use of display devices, such as an organic light-emitting diode (OLED) display device, a liquid crystal display (LCD) and a plasma display panel (PDP), increases.

From among them, the OLED display device has low power consumption and can be fabricated thinner compared to the LCD that requires a backlight because the OLED display device is a self-emissive device. Furthermore, the OLED display device has advantages of a wide viewing angle and fast response speed. The process technology of the OLED display device has been developed up to a large screen mass production technology level, and thus the market of the OLED display device is expanded while competing with the LCD.

A pixel of the OLED display device includes an OLED, that is, a self-emissive device. The OLED display device may be divided in various ways depending on the type of emission material, an emission method, an emission structure, a driving method, etc. The OLED display device may be divided into fluorescent emission and phosphorescent emission depending on its emission method, and may be divided into a top emission structure and a bottom emission structure depending on its emission structure. Furthermore, the OLED display device may be divided into a passive matrix OLED (PMOLED) and an active matrix OLED (AMOLED) depending on its driving method.

Efforts to reduce the bezel area of a display device are recently made. The bezel area is a non-display area in which an input image is not implemented. An increase in the area of the bezel area is problematic because it deteriorates the aesthetic sense and visibility.

BRIEF SUMMARY

The present disclosure provides a display device having an improved film lifting phenomenon.

In an aspect, a display device includes a substrate, a data link line, a power link line, and a dummy pattern. The substrate includes a display area in which pixels are arranged and a non-display area outside the display area. The data link line is positioned in the non-display area to deliver a predetermined signal to the pixels. The power link line is spaced apart from the data link line at a predetermined distance in the non-display area and delivers a predetermined power to the pixels. The dummy pattern is positioned between the data link line and the power link line in the non-display area.

BRIEF DESCRIPTION OF THE SEVERAL VIEWS OF THE DRAWINGS

The accompanying drawings, which are included to provide a further understanding of the disclosure and are incorporated in and constitute a part of this specification, illustrate embodiments of the disclosure and together with the description serve to explain the principles of the disclosure. In the drawings.

DETAILED DESCRIPTION

Figure 1:
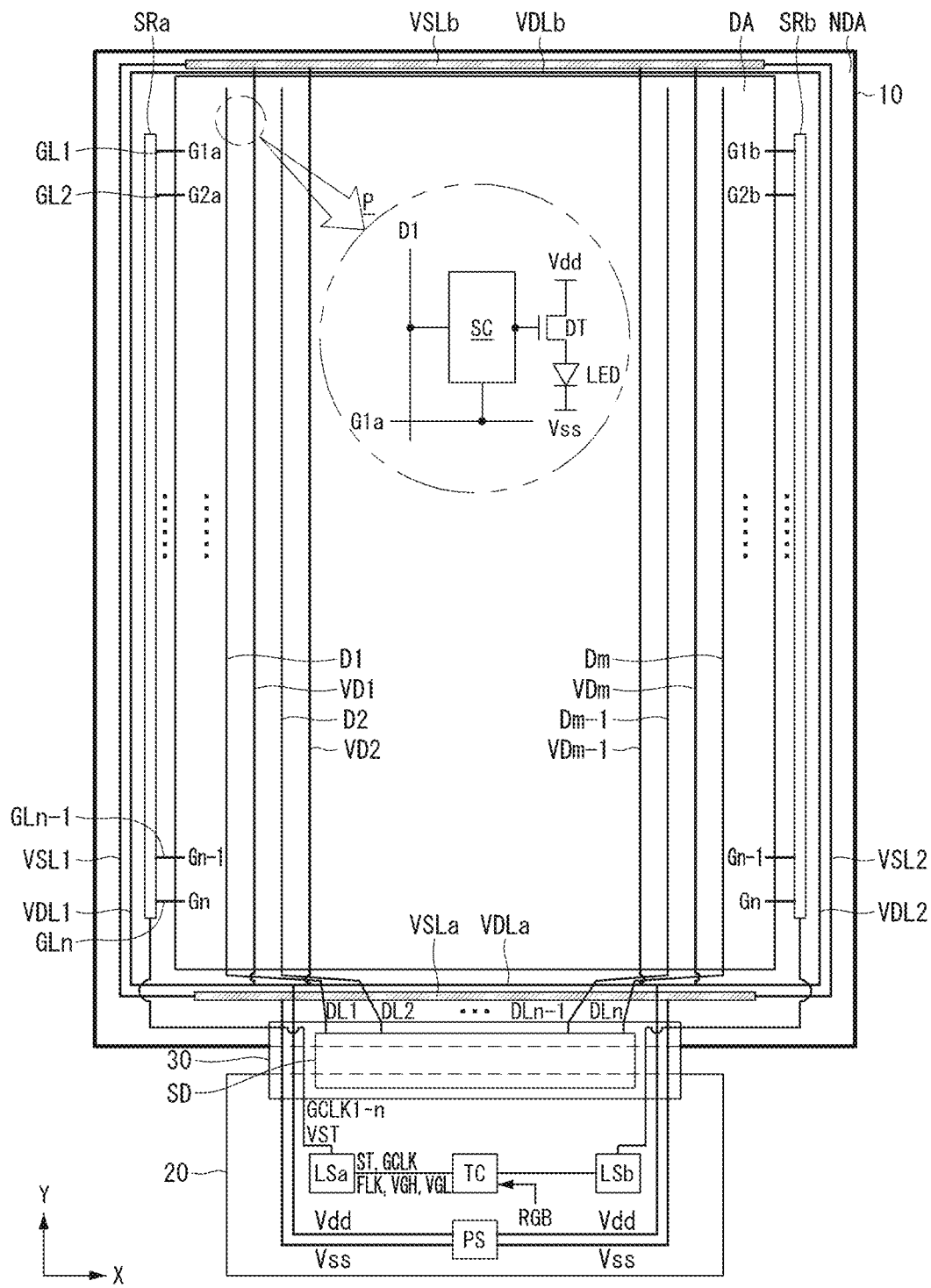
FIG. 1 is a plan view schematically showing the configuration of a display device according to an embodiment of the present disclosure.

Hereinafter, embodiments of the present disclosure are described with reference to the accompanying drawings. Throughout the specification, the same reference numeral substantially denotes the same element. In the following description, a detailed description of known technology or element related to the present disclosure will be omitted if it is deemed to make the gist of the present disclosure unnecessarily vague. In describing several embodiments, the same element is representatively described at the introductory part of this specification, and may be omitted in other embodiments.

Terms including ordinal numbers, such as the first and the second, may be used to describe various elements, but the elements are not limited by the terms. The terms are used to only distinguish one element from the other element.

A display device according to an embodiment of the present disclosure may be implemented as an electronluminescent display device, an LCD, an electrophoresis display device, etc., but is not limited thereto. Hereinafter, a display device is illustrated as being an electronluminescent display device including an OLED, for convenience of description.

Figure 2:
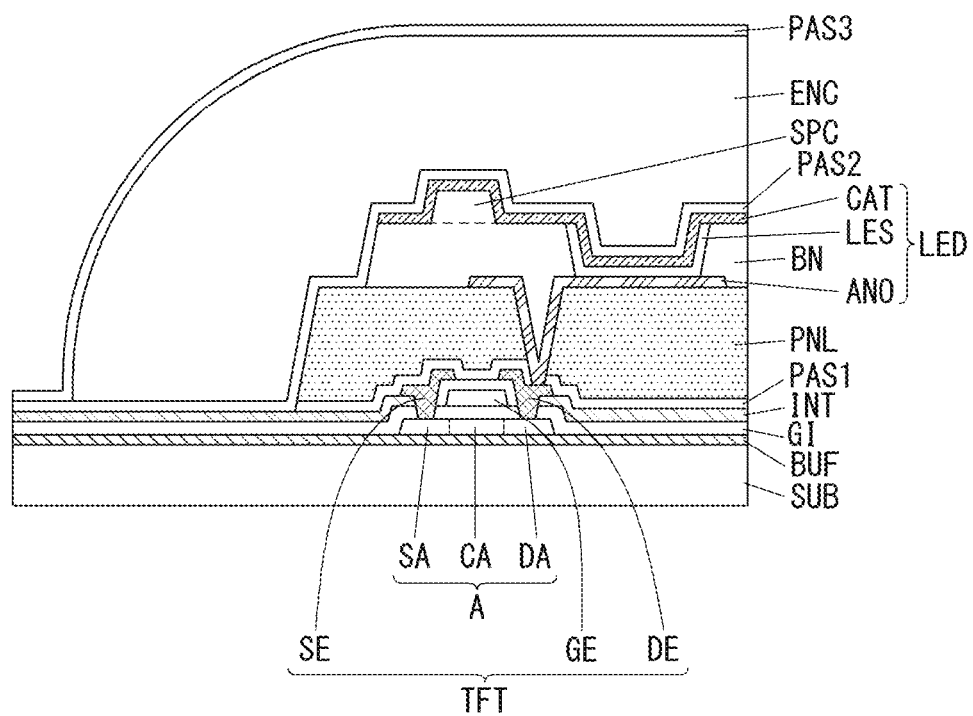
FIG. 2 is a cross-sectional view schematically showing the structure of a pixel.

FIG. 1 is a plan view schematically showing the configuration of a display device according to an embodiment of the present disclosure. FIG. 2 is a cross-sectional view schematically showing the structure of a pixel.

Referring to FIG. 1, the display device according to an embodiment of the present disclosure may include a display panel 10, a data driver, a gate driver, a power supply part PS, a timing controller TC, etc.

The display panel 10 includes a substrate in which a display area DA and a non-display area NDA are defined. The display area DA is the area in which an input image is implemented. The non-display area NDA is the area which is positioned outside the display area DA and in which an input image is not implemented.

The display area DA is the area in which a pixel array where a plurality of pixels P is arrayed is positioned. The non-display area NDA is the area in which the shift registers SRa and SRb of a gate driving circuit, various link lines GL1~GLn and DL1~DLn, power supply lines VDL1, VDL2, VSL1, and VSL2, and power supply electrodes VDLa, VDLb, VSLa, and VSLb are disposed.

The pixel array positioned in the display area DA includes a plurality of data lines D1~Dm and a plurality of gate lines G1~Gn disposed to cross each other. The pixels P may be defined by the intersection structures of the plurality of data lines D1~Dm and gate lines G1~Gn, but are not limited thereto.

Each of the pixels P includes an LED, a driving thin film transistor (hereinafter referred to as a "driving TFT") DT for controlling the amount of current flowing into the LED, and a programming unit SC for setting the gate-source voltage of the driving TFT DT. The pixels P of the pixel array are supplied with a first power Vdd (or, a high potential voltage) from the power supply part PS through first power supply lines VDL1 and VDL2, first power supply electrodes VDLa and VDLb, and first power lines VD1~VDm. The pixels P of the pixel array are supplied with a second power Vss (or, a low potential voltage) from the power supply part PS through second power supply lines VSL1~VSL2 and second power supply electrodes VSLa and VSLb.

The first power lines VD1~VDm may be supplied with the first power Vdd on both sides thereof through the lower first power supply electrode VDLa positioned in the non-display area NDA on the side to which a connection member 30 is attached and the upper first power supply electrode VDLb positioned in the non-display area NDA on the opposite side. The lower first power supply electrode VDLa and the upper first power supply electrode VDLb may have both ends connected by the first power supply lines VDL1 and VDL2. Accordingly, there is an effect in that the degradation of display quality attributable to an RC (resistance, capacitance) increase according to the position of pixels disposed in the display area DA can be minimized, but the present disclosure is not limited thereto.

A programming unit SC may include at least one switch TFT and at least one storage capacitor. The switch TFT is turned on in response to a scan signal from a gate line GL, and thus applies a data voltage from a data line D1 to one electrode of the storage capacitor. The driving TFT DT controls the amount of emission of an LED by controlling the amount of current supplied to the LED based on the amount of a voltage charged in the storage capacitor. The amount of emission of the LED is proportional to the amount of current supplied to the driving TFT DT.

A TFT configuring a pixel may be implemented in a p type or an n type. Furthermore, the semiconductor layer of the TFT configuring the pixel may include amorphous silicon, polysilicon or oxide. The LED includes an anode electrode, a cathode electrode, and an emission structure interposed between the anode electrode and the cathode electrode. The anode electrode is connected to the driving TFT DT. The emission structure includes an emission layer EML, and may have a hole injection layer (HIL) and a hole transport layer (HTL) disposed on one side thereof and an electron transport layer (ETL) and an electron injection layer (EIL) disposed on the other side thereof with the emission layer EML interposed therebetween.

The data driver has a data IC SD mounted thereon, and includes the connection member 30 having one side connected to one end of a source printed circuit board 20 and having the other side attached to the non-display area NDA of the substrate. The connection member may be a chip on film (COF) or a chip on panel (COP), but is not limited thereto.

The data IC SD generates a data voltage by converting digital video data, received from the timing controller TC, into an analog gamma compensation voltage. The data voltage output by the data IC SD is supplied to the data lines D1~Dm.

A gate driver of a GIP type includes level shifters LSa and LSb mounted on the source printed circuit board 20 and shift registers SRa and SRb formed in the non-display area NDA of the substrate to receive signals supplied by the level shifters LSa and LSb.

The level shifters LSa and LSb are supplied with signals, such as a start pulse ST, gate shift clocks GLCK, and a flicker signal FLK, from the timing controller TC, and are supplied with driving voltages, such as a gate high voltage VGH and a gate low voltage VGL from the timing controller TC. The start pulse ST, gate shift clocks GCLK and flicker signal FLK are signals that swing between approximately 0 V and 3.3 V. The gate shift clocks GLCK1~n are n-phase clock signals having a given phase difference. The gate high voltage VGH is a threshold voltage or more of a TFT formed in the pixel array of the display panel 10, and is approximately 28 V. The gate low voltage VGL is lower than the threshold voltage of a TFT formed in the pixel array of the display panel 10, and is approximately −5 V.

The output signals of the level shifters LSa and LSb may be supplied to shift registers SRa and SRb through lines formed in the connection member 30 in which the data IC SD is positioned and line on glass (LOG) lines formed in the substrate. The shift registers SRa and SRb may be directly formed on the non-display area NDA of the substrate by a GIP process.

The shift registers SRa and SRb sequentially make gate pulses swing between the gate high voltage VGH and the gate low voltage VGL by shifting the start pulse VST, received from the level shifters LSa and LSb, in response to the gate shift clock signals GCLK1~GCLKn. Gate pulses output by the shift registers SRa and SRb are sequentially supplied to the gate lines G1a~Gn and G1b~Gn.

The timing controller TC receives a timing signal, such as a vertical sync signal, a horizontal sync signal, a data enable signal or a main clock received from a host system (not shown), and synchronizes operating timing of the data IC SD and the level shifters LSa and LSb and shift registers SRa and SRb of the gate driver. A data timing control signal for controlling the data IC SD may include a source sampling clock SSC, a source output enable signal SOE, etc. A gate timing control signal for controlling the level shifters LSa and LSb and shift registers SRa and SRb of the gate driver may include a gate start pulse GSP, a gate shift clock GSC, a gate output enable signal GOE, etc.

In FIG. 1, the shift registers SRa and SRb have been illustrated as being disposed on both sides outside the display area DA, so gate pulses are supplied to the gate lines G1a~Gn and G1b~Gn on both ends of the display area DA, but the present disclosure is not limited thereto. For example, the shift registers may be disposed only on one side of the display area DA so that gate pulses are supplied to the gate lines G1a~Gn and G1b~Gn on one side of the display area DA. If the shift registers SRa and SRb are disposed on both sides outside the display area DA, a gate pulse having the same phase and amplitude is supplied to gate lines disposed in the same horizontal line of the pixel array.

The gate driver has been illustrated as being a GIP type, but is not limited thereto. For example the gate driver may be provided in a connection member type and bonded to the non-display area NDA of the display panel 10.

Referring to FIG. 2, a buffer layer BUF having a single-layered or multi-layered structure may be positioned on the substrate SUB. The substrate SUB may be made of a material having given flexibility. If the substrate SUB is made of a material, such as polyimide, the buffer layer BUF may be configured with a single layer made of any one of an inorganic material and an organic material in order to prevent a light-emitting element from being damaged by impurities, such as alkali ions drained from the substrate SUB in a subsequent process. In contrast, the buffer layer BUF may be configured with multiple layers made of different inorganic materials. Furthermore, the buffer layer BUF may be configured with multiple layers including an organic material layer and an inorganic material layer. The inorganic material layer may include any one of a silicon oxide (SiOx) film and a silicon nitride (SiNx) film. The organic material may include photoacryl.

A semiconductor layer A may be positioned on the buffer layer BUF. The semiconductor layer A may include a source area SA and a drain area DA spaced apart from each other with a channel area CA interposed therebetween. The source area SA and the drain area DA may be areas that are conductive. The semiconductor layer A may be formed using amorphous silicon or polycrystalline silicon crystallized from amorphous silicon. In one embodiment, the semiconductor layer A may be made of any one of zinc oxide (ZnO), indium zinc oxide (InZnO), indium gallium zinc oxide (InGaZnO) or zinc tin oxide (ZnSnO). Furthermore, the semiconductor layer A may be made of a low molecular or high molecular organic matter, such as merocyanine, phthalocyanine, pentacene or thiophene polymer.

A gate insulating film GI to cover the semiconductor layer A is positioned on the buffer layer BUF in which the semiconductor layer A is positioned. The gate insulating film GI may be configured with a single layer made of an inorganic material or multiple layers made of different inorganic materials. For example, the gate insulating film GI may be made of a silicon oxide (SiOx) film or a silicon nitride (SiNx) film or a dual layer thereof.

The gate electrode GE of the TFT and a gate line (not shown) connected to the gate electrode GE may be disposed on the gate insulating film GI so that they overlap at least some area of the channel layer CA of the semiconductor layer A. The gate electrode GE and the gate line may be any one selected from the group of molybdenum (Mo), aluminum (Al), chrome (Cr), gold (Au), titanium (Ti), nickel (Ni), and copper (Cu) or an alloy thereof, and may be configured with a single layer or multiple layers.

An interlayer insulating film INT may be positioned on the gate insulating film GI in which the gate electrode GE and the gate line are disposed in such a way as to cover them. The interlayer insulating film INT may be configured with a single layer made of an inorganic material or multiple layers made of different inorganic materials. For example, the interlayer insulating film INT may be configured with a silicon oxide (SiOx) film or a silicon nitride (SiNx) film.

The source electrode SE and drain electrode DE of the TFT and a data line (not shown) may be positioned on the interlayer insulating film INT. The source electrode SE and the drain electrode DE may be connected to the source area SA and drain area DA of the semiconductor layer exposed through contact holes that penetrate the gate insulating film GI and the interlayer insulating film INT, respectively. The source electrode SE, the drain electrode DE, and the data line may be any one selected from the group of molybdenum (Mo), aluminum (Al), chrome (Cr), gold (Au), titanium (Ti), nickel (Ni), and copper (Cu) or an alloy thereof, and may be configured with a single layer or multiple layers.

A first passivation film PAS1 may be positioned to cover the source electrode SE, the drain electrode DE, and the data line. The first passivation film PAS1 may be configured with a single layer made of an inorganic material or multiple layers made of different inorganic materials. For example, the first passivation film PAS1 may be configured with a silicon oxide (SiOx) film, a silicon nitride (SiNx) film or a dual layer thereof.

A planarization film PNL may be positioned on the first passivation film PAS1. The planarization film PNL functions to protect a lower structure while reducing the step of the lower structure, and may be configured with an organic material layer. For example, the planarization film PNL may be configured with a photoacryl layer.

An anode electrode ANO may be positioned on the planarization film PNL. The anode electrode ANO is connected to the drain electrode DE exposed through a contact hole that penetrates the planarization film PNL and the first passivation film PAS1. The anode electrode ANO may be made of transparent conductive material, such as indium tin oxide (ITO), indium zinc oxide (IZO) or zinc oxide (ZnO).

A bank layer BN having an opening through which the anode electrode ANO is exposed may be formed on the planarization film PNL. The opening of the bank layer BN may be an area that defines an emission area. The bank layer BN may be made of an organic matter, such as polyimide, benzocyclobutene series resin or polyacrylate. A spacer SPC is formed on the bank layer BN. The spacer SPC functions to prevent a mask for fabricating a subsequent light-emitting stack LES from coming into contact with a stack under the spacer SPC. The spacer SPC is fabricated simultaneously with the bank layer BN using a half-tone mask. Accordingly, the spacer SPC may have the same material as the bank layer BN, and thus the spacer SPC and the bank layer BN form one body.

A light-emitting stack LES and a cathode electrode CAT are sequentially disposed on the anode electrode ANO exposed through the emission area of the bank layer BN, thereby configuring a light-emitting device LED. The light-emitting stack LES may include a hole-related layer, a light-emitting layer, and an electron-related layer. The cathode electrode CAT may be made of magnesium (Mg), calcium (Ca), aluminum (Al) or silver (Ag) or an alloy thereof having a low work function. In an embodiment of the present disclosure, the light-emitting stack LES has been illustrated as being positioned on the anode electrode ANO and the cathode electrode CAT has been illustrated as being positioned on the light-emitting stack LES, but the light-emitting stack LES may be positioned on the cathode electrode CAT and the anode electrode ANO may be positioned on the light-emitting stack LES.

A second passivation film PAS2 may be positioned on the cathode electrode CAT. The second passivation film PAS2 may be configured with a single layer made of an inorganic material or multiple layers made of different inorganic materials. For example, the second passivation film PAS2 may be configured with a silicon oxide (SiOx) film, a silicon nitride (SiNx) film or a dual layer thereof. The second passivation film PAS2 may be positioned in the display area DA and the non-display area NDA.

An encapsulation film ENC to cover the cathode electrode CAT and the bank layer BN may be positioned on the second passivation film PAS2. The encapsulation film ENC functions to prevent external moisture or oxygen from penetrating into the light-emitting stack LES, and may be configured with a single layer made of an organic layer or an inorganic layer or a multi-layered structure in which an inorganic layer and an organic layer are alternately disposed. In an embodiment of the present disclosure, the encapsulation film ENC has been illustrated as being configured with a single layer made of an organic layer. The encapsulation film ENC may be positioned to cover the pixels of the display area DA.

A third passivation film PAS3 is positioned on the encapsulation film ENC in order to prevent moisture or oxygen from penetrating into the encapsulation film ENC. The third passivation film PAS2 may be positioned in the display area DA and the non-display area NDA.

Figure 3:
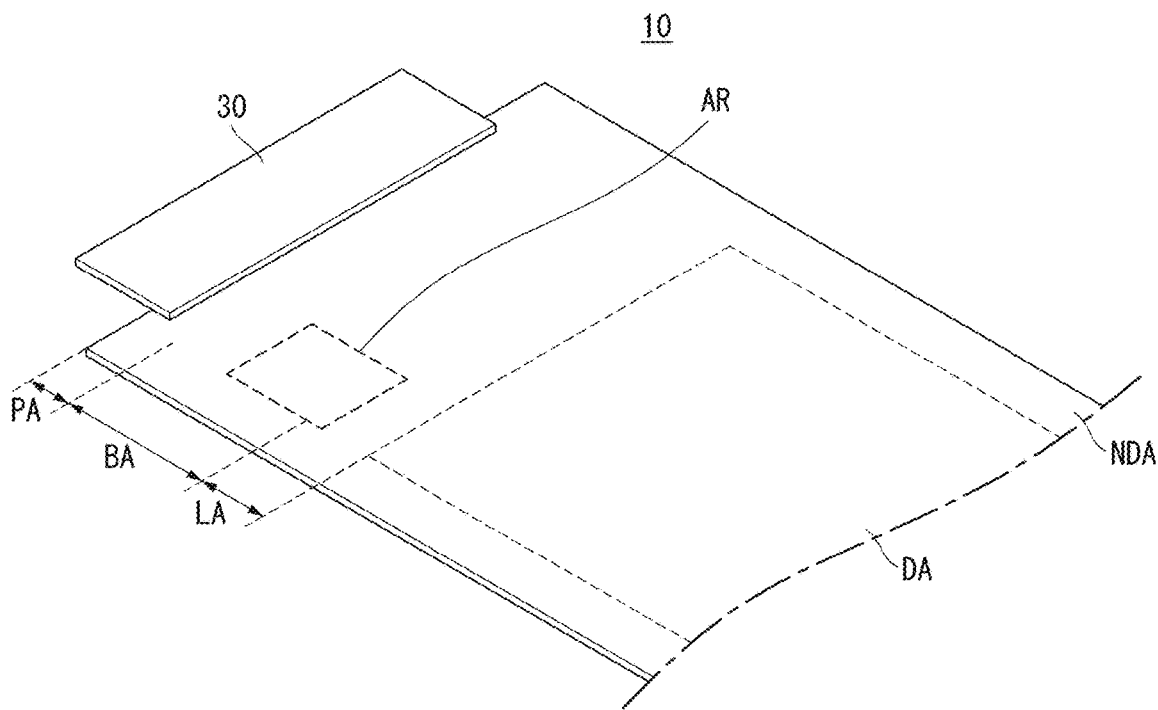
FIG. 3 is a perspective view showing a display device according to an embodiment of the present disclosure.
Figure 3:
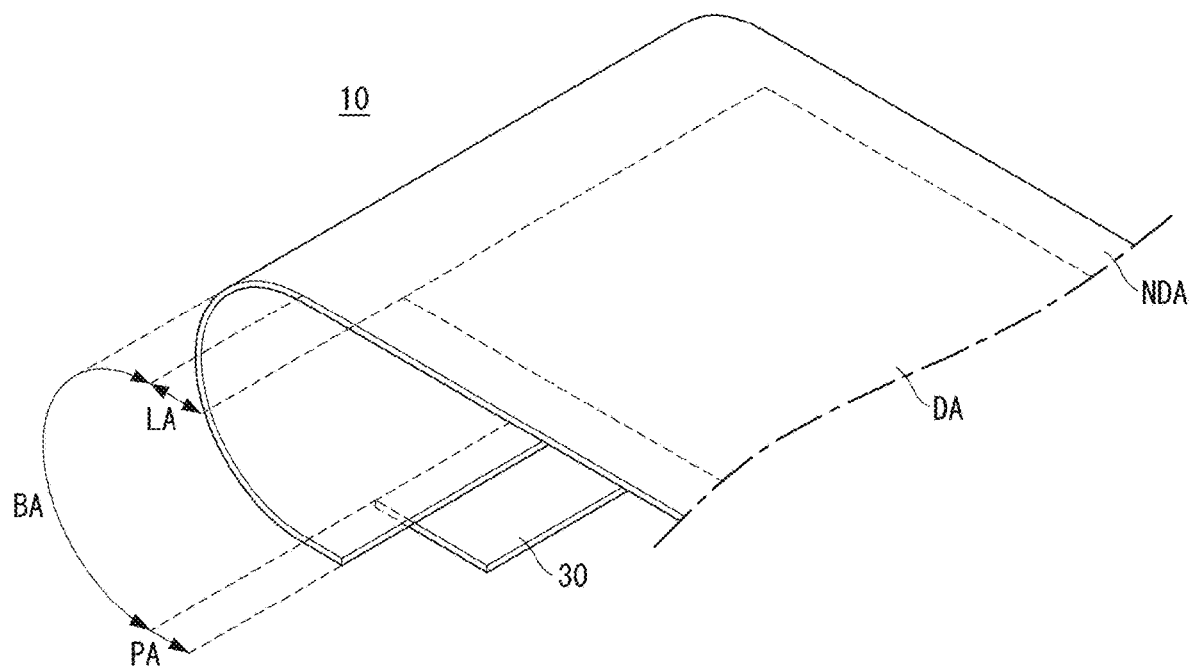
Figure 4:
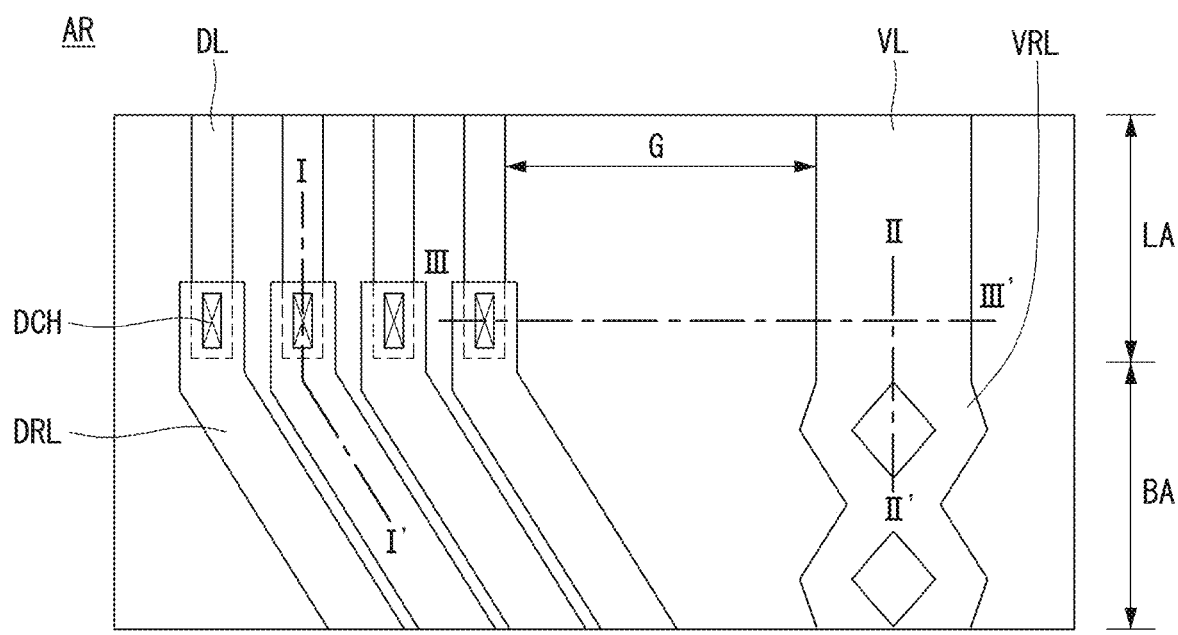
FIG. 4 is an enlarged plan view of an AR area of FIG. 3.
Figure 5:
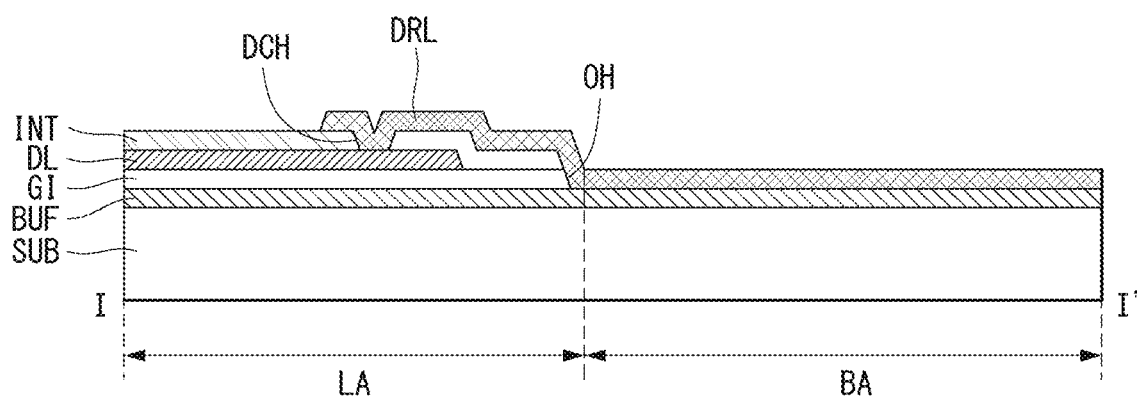
FIG. 5 is a cross-sectional view of FIG. 4, which is taken along line I-I'.
Figure 6:
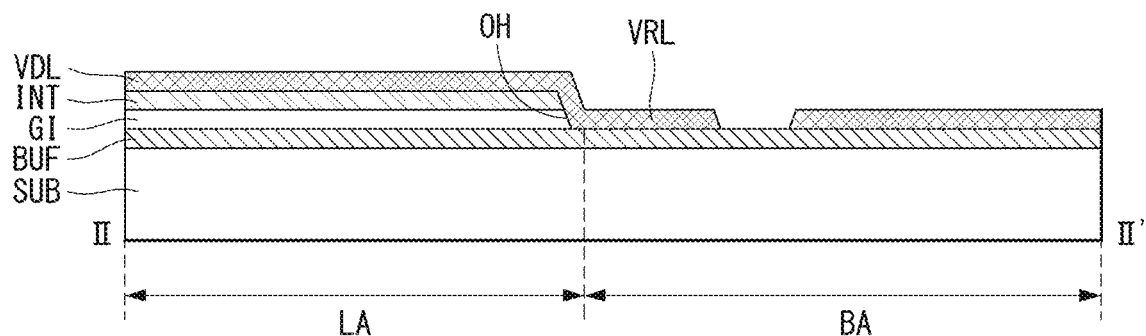
FIG. 6 is a cross-sectional view of FIG. 4, which is taken along line II-II'.
Figure 7:
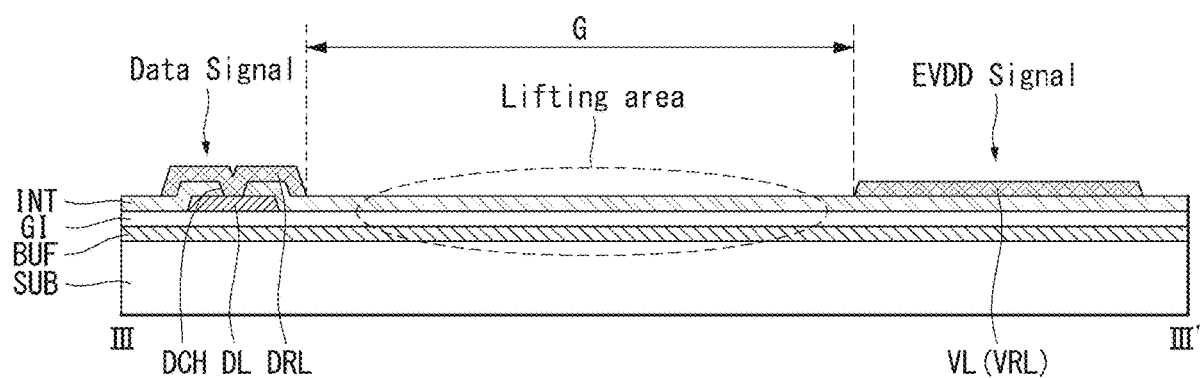
FIG. 7 is a cross-sectional view of FIG. 4, which is taken along line III-III'.
Figure 8:
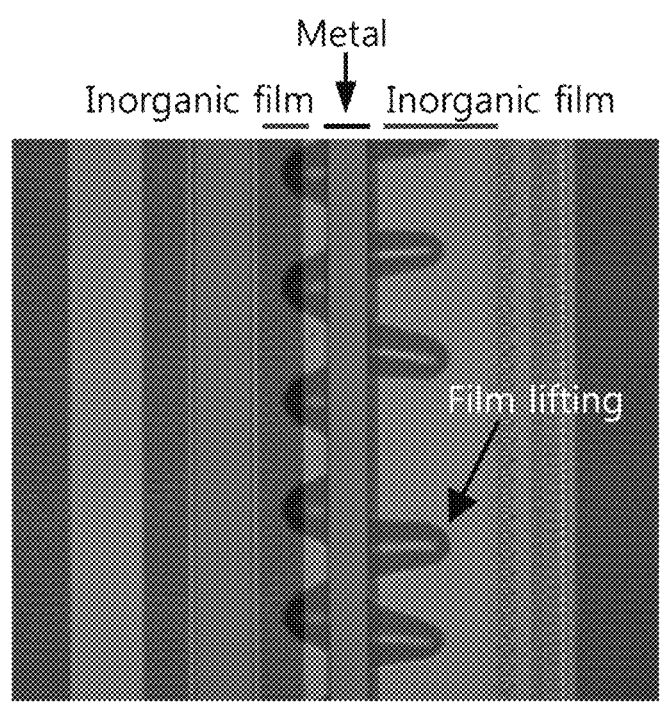
FIG. 8 is a diagram for illustrating a comparison between film lifting phenomena in the area where a conductive layer is positioned and the area where a conductive layer is not positioned.

FIG. 3 is a perspective view showing a display device according to an embodiment of the present disclosure. FIG. 4 is an enlarged plan view of the AR area of FIG. 3. FIG. 5 is a cross-sectional view of FIG. 4, which is taken along line I-I'. FIG. 6 is a cross-sectional view of FIG. 4, which is taken along line FIG. 7 is a cross-sectional view of FIG. 4, which is taken along line FIG. 8 is a diagram for illustrating a comparison between film lifting phenomena in the area where a conductive layer is positioned and the area where a conductive layer is not positioned.

Referring to FIGS. 3 and 4, the display device includes the substrate SUB and the connection member 30.

The substrate SUB includes the display area DA and the non-display area NDA. A plurality of pixels is disposed in the display area DA. The pixels are arranged in a red (R), green (G), and blue (B) or R, G, B, and white (W) manner within the display area DA to implement a full color. The pixels may be partitioned by gate lines and data lines that cross each other, but the present disclosure is not limited thereto.

The non-display area NDA includes a pad area PA in which pads bonded to the connection member 30 are disposed, and a link area LA and a bending area BA sequentially defined between the display area DA and the pad area PA.

The connection member 30 includes bumps (or terminals). The bumps of the connection member 30 may be bonded to the respective pads of the pad area PA through an anisotropic conductive film. The connection member 30 may be a chip on film (COF) in which a driving integrated circuit (IC) has been mounted on a flexible film. Furthermore, the connection member 30 may be implemented in a chip on glass (COG) type in which it is directly bonded to the pads on a substrate through a COG process. Furthermore, the connection member 30 may be a flexible member, such as a flexible flat cable (FFC) or a flexible printed circuit (FPC).

Driving signals supplied through the connection member 30 are supplied to the signal lines of the display area DA via the pad area PA, the bending area BA, and the link area LA through a link line LL and a routing line. A signal line includes the data lines (D1~Dm of FIG. 1) and the power lines (VD1~VDm of FIG. 1) disposed in the display area DA. The link line LL includes a data link line DL electrically connected to the data lines (D1~Dm of FIG. 1) and a power link line VL connected to the power lines (VD1~VDm of FIG. 1) and/or the power supply lines VDL1 and VDL2. The routing line includes a data routing line DRL connecting the data link line DL and a data pad (not shown) and a power routing line VRL connecting the power link line VL and the power pad (not shown).

In the display device, the space where the pad area PA, the connection member 30, etc., may be disposed other than the display area DA in which an input image is implemented needs to be sufficiently allocated. Such a space corresponds to a bezel area. The bezel area is recognized by a user who is positioned at the front of a display device, thus becoming a factor to deteriorate an aesthetic impression and visibility.

In a display device according to an embodiment of the present disclosure, an edge on one side of the substrate SUB is backward bent to have given curvature. The substrate SUB is bent, and thus an area of the substrate whose section has a curved surface may be defined as the bending area BA.

As the substrate SUB is bent, the pad area PA may be positioned to overlap the display area DA in the back direction of the display area DA. Accordingly, a bezel area recognized at the front of a display device can be minimized.

To this end, the substrate SUB may be made of a bendable and flexible material. For example, the substrate SUB may be made of a plastic material, such as polyimide (PI). Furthermore, the routing lines DRL and VRL disposed in the bending area BA may be made of a material having flexibility. For example, the routing lines DRL and VRL may be made of a material, such as a metal nano-wire, a metal mesh or a carbon nano-tube (CNT), but are not limited thereto.

The routing lines DRL and VRL may have a shape capable of dispersing stress that acts when the substrate is bent. For example, the routing lines DRL and VRL may have a zigzag pattern in the bending area BA. Alternatively, the routing lines DRL and VRL may have a shape branched into a plurality of patterns respectively to prevent that a crack occurs when stress is concentrated. Alternatively, the routing lines DRL and VRL may be formed to extend from the direction where stress acts toward a diagonal direction tilted at a preset angle by taking a bending direction into consideration.

In some embodiments, the data link line DL and the power link line VL are spaced apart at a selected gap G. A distance of the gap G can be appropriately selected to reduce signal interferences between lines or various components within the display device, avoid short-circuiting. The gap G can also be determined according to various manufacturing designs. For example, as described above, the routing lines DRL and VRL extended from the lines DL and VL respectively, may be formed in a zigzag pattern or a diagonal pattern. In this case, the data link line DL and the power link line VL are spaced apart at a selected gap in order to prevent lines to which different signals are applied from being short-circuited. To this end, the data link line DL and the power link line VL are spaced apart at the selected gap G in order to secure the space for forming the above-described pattern. In some embodiments, the gap G can be predetermined at the manufacturing stage. However, in one or more embodiments, the gap G is not necessarily predetermined and may be suitably selected based on the reasons set forth above as well as other reasons.

For example, if the distance between the data link line DL and the power link line VL is small, the data link line DL and the power link line VL may be mutually influenced electrically due to capacitor coupling through parasitic capacitance therebetween. For example, power may vary when a data voltage in the data link line DL is changed. As a result, brightness may be changed unwontedly because current flowing into the light-emitting elements of pixels is changed. Accordingly, in order to exclude the capacitor coupling influence between the data link line DL and the power link line VL, the data link line DL and the power link line VL may be spaced apart to have a sufficient gap G.

Referring to FIGS. 5 to 7, a buffer layer BUF and a gate insulating film GI are disposed over the substrate SUB. A data link line DL is disposed on the gate insulating film GI. The data link line DL is positioned to correspond to the link area LA. The data link lines DL are extended from the data lines (D1~Dm of FIG. 1) of the display area DA.

The data link line DL may be made of the same material as the gate electrode (GE of FIG. 2) of a transistor within the display area DA in a layer corresponding to the gate electrode (GE of FIG. 2). The data link line DL may be positioned in a layer different from that of the data lines (D1~Dm of FIG. 1) in order to prevent a short with other signal lines extended in the direction crossing the extension direction of the data lines (D1~Dm of FIG. 1). For example, the data lines (D1~Dm of FIG. 1) and the power supply electrodes VDLa, VDLb, VSLa, and VSLb may be formed on the same layer as the source/drain electrodes (SE and DE of FIG. 2) of the transistor within the display area DA, which are disposed to cross each other. Accordingly, in order to prevent a short occurring between them, the data lines (D1~Dm of FIG. 1) may be connected to the data routing lines DRL via the data link lines DL disposed in a different layer.

The data routing line DRL is positioned on the data link line DL with an interlayer insulating film INT interposed therebetween. The data routing line DRL is connected to the data link line DL through a data contact hole DCH penetrating the interlayer insulating film INT. The data routing line DRL is connected to the data link line DL in the link area LA. The data routing lines are extended along the bending area BA and connected to corresponding pads of the pad area PA. The data routing line DRL may be made of the same material as the source/drain electrodes (SE and DE of FIG. 2) of the transistor within the display area DA in a layer corresponding to the source/drain electrodes (SE and DE of FIG. 2).

Insulating films disposed on the bending area BA may be removed. That is, an open hole OH penetrating one or more of the interlayer insulating film INT and the gate insulating film GI is formed in the bending area BA. If the open hole OH penetrates the interlayer insulating film INT and the gate insulating film GI, the data routing line DRL may be positioned on the interlayer insulating film INT in the link area LA and may be positioned on the buffer layer BUF in the bending area BA.

In some embodiments, the open hole OH may be formed to further penetrate the buffer layer BUF, so the substrate SUB is exposed. In this case, the data routing line DRL may be positioned on the interlayer insulating film INT in the link area LA and may be positioned on the substrate SUB in the bending area BA. It may be preferable to leave the buffer layer BUF to block moisture permeation penetration through the substrate SUB.

An embodiment of the present disclosure can control a total thickness of the display panel in the bending area BA by previously removing at least one insulating film formed in the bending area BA, and thus has an advantage in that it can easily bend the substrate SUB.

The power link line VL is positioned on the interlayer insulating film INT. The power link line VL is positioned in accordance with the link area LA. The power link line VL is extended from the power lines (VD1~VDm of FIG. 1) and/or the power supply lines VDL1 and VDL2. The power link line VL may be made of the same material as the source/drain electrodes (SE and DE of FIG. 2) in a layer corresponding to the source/drain electrodes (SE and DE of FIG. 2) of a transistor within the display area DA.

The power routing line VRL is connected to the power link line VL on the interlayer insulating film INT. The power routing line VRL may be a part branched or extended from the power link line VL as one body along with the power link line VL. The power routing lines VRL are extended along the bending area BA and connected to corresponding pads of the pad area PA.

As described above, insulating films disposed on the bending area BA may be removed. That is, the open hole OH penetrating one or more of the interlayer insulating film INT and the gate insulating film GI is formed in the bending area BA. If the open hole OH penetrates the interlayer insulating film INT and the gate insulating film GI, the power routing line VRL may be positioned on the interlayer insulating film INT in the link area LA and may be positioned on the buffer layer BUF in the bending area BA.

In some embodiments, the open hole OH may be formed to further penetrate the buffer layer BUF, so the substrate SUB may be exposed. In this case, the power routing line VRL may be positioned on the interlayer insulating film INT in the link area LA, and may be positioned on the substrate SUB in the bending area BA.

If the display device is continuously exposed to an environment in which temperature varies during a process, a lifting phenomenon may occur between the substrate SUB and the buffer layer BUF. That is, the substrate SUB includes an organic material, such as polyimide (PI) and the buffer layer BUF includes an inorganic material, such as SiNx or SiOx, and thus they have different heat characteristics (e.g., heat strain) in their constituent materials. Accordingly, if the display device is exposed to a temperature change environment, a film lifting phenomenon may occur due to the separation of an interface because the adhesion of the interface is weakened. If a film lifting phenomenon occurs as described above, this is problematic because a moisture permeability path causing device degradation may be formed between the separated substrate SUB and buffer layer BUF.

The film lifting phenomenon may be further problematic in the link area LA neighboring the bending area BA. That is, when the substrate SUB is bent, stress may be concentrated on the link area LA neighboring the bending area BA. Accordingly, a film lifting phenomenon may frequently occur because the concentrated stress is provided between the substrate SUB and buffer layer BUF link area having weakened adhesion in the link area LA.

The data link line DL and the power supply link line VL are made of the metal. Therefore, a lifting phenomenon may not occur in the area in which the data link line DL and the power link line VL are disposed because a heat characteristic deviation between the substrate SUB and the buffer layer BUF can be compensated by the metal. For example, the data link line DL may be made of molybdenum (Mo). Molybdenum (Mo) has stronger thermal strain than $SiO_2$, that is, a main material configuring the buffer layer BUF. Accordingly, if the display device is exposed to an environment in which a temperature change during the process, metal configuring the data link line DL can reduce a deviation of the thermal characteristics of the substrate SUB and the buffer layer BUF because it can reduce the thermal strain of the buffer layer BUF. Referring to FIG. 8, it may be seen that film lifts a lot more occur in the area where metal is not positioned than in the area where metal is positioned.

As described above, in the link area LA neighboring the bending area BA, the data link line DL and the power link line VL are spaced apart at a selected distance. Accordingly, a corresponding area is vulnerable to a film lift defect attributable to interface separation.

First Embodiment

Figure 9:
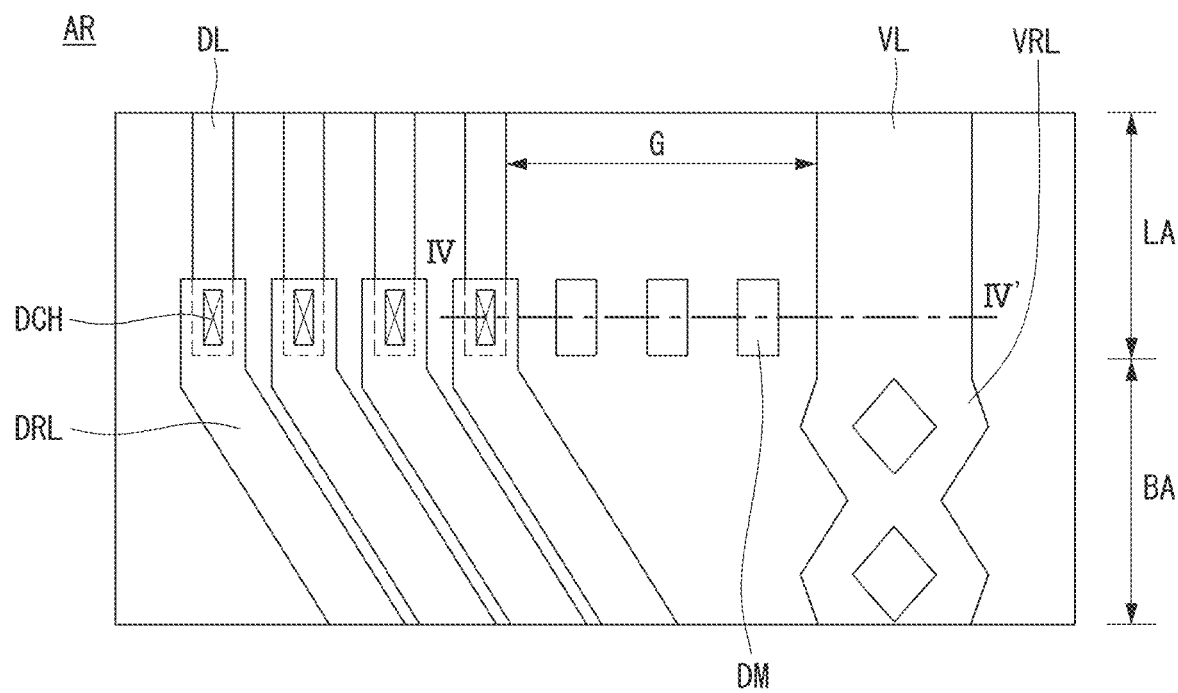
FIG. 9 is an enlarged plan view of the AR area of FIG. 3 according to a first embodiment of the present disclosure.
Figure 10:
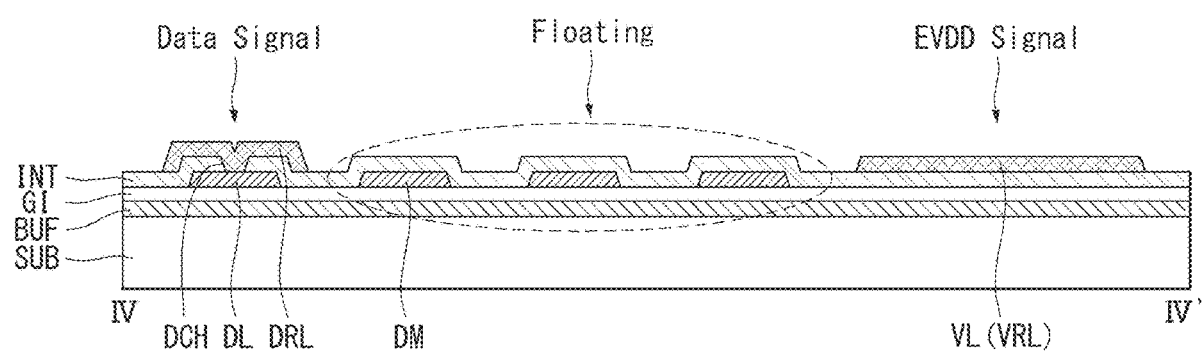
FIG. 10 is a cross-sectional view of FIG. 9, which is taken along line IV-IV'.

FIG. 9 is an enlarged plan view of the AR area of FIG. 3 according to a first embodiment of the present disclosure. FIG. 10 is a cross-sectional view of FIG. 9, which is taken along line IV-IV'.

Referring to FIG. 9, a display device according to the first embodiment of the present disclosure includes a dummy pattern DM formed between a data link line DL and a power link line VL. The dummy pattern DM may be positioned in a link area LA and/or a bending area BA on which stress may be concentrated when a substrate SUB is bent. The dummy pattern DM is not connected to other signal lines, and any signal is not applied to the dummy pattern. That is, the dummy pattern DM is floated so that a specific signal is not applied to the dummy pattern. The dummy pattern DM is made of a metal material, and compensates for a heat characteristic deviation between the substrate SUB and a buffer layer BUF in a temperature change environment during a process. Accordingly, the first embodiment of the present disclosure has an advantage in that it can provide a display device having an improved film lifting phenomenon.

Referring to FIG. 10, the buffer layer BUF and a gate insulating film GI are disposed on the substrate SUB. The data link line DL and the power link line VL are disposed on a gate insulating film GI. The data link line DL is positioned in the link area LA. The data link lines DL are extended from the data lines (D1~Dm of FIG. 1) of a display area DA.

The data link line DL may be made of the same material as the gate electrode (GE of FIG. 2) of a transistor within the display area DA in a layer corresponding to the gate electrode (GE of FIG. 2).

The data lines (D1~Dm of FIG. 1) may be connected to data routing lines DRL via the data link lines DL disposed in a different layer. The data routing line DRL is positioned on the data link line DL with an interlayer insulating film INT interposed therebetween. The data routing line DRL is connected to the data link line DL through a data contact hole DCH penetrating the interlayer insulating film INT. The data routing line DRL is connected to the data link line DL in the link area LA. The data routing lines are extended along the bending area BA and connected to corresponding pads of the pad area PA. The data routing line DRL may be made of the same material as the source/drain electrodes (SE and DE of FIG. 2) of a transistor within the display area DA in a layer corresponding to the source/drain electrodes (SE and DE of FIG. 2).

The power link line VL is positioned on the interlayer insulating film INT. The power link line VL is positioned in accordance with the link area LA. The power link line VL is extended from the power lines (VD1~VDm of FIG. 1) and/or the power supply lines VDL1 and VDL2. The power link line VL may be made of the same material as the source/drain electrodes (SE and DE of FIG. 2) of the transistor within the display area DA in the layer corresponding to the source/drain electrodes (SE and DE of FIG. 2).

A power routing line VRL is connected to the power link line VL on the interlayer insulating film INT. The power routing line VRL may be part branched or extended from the power link line VL as one body along with the power link line VL. The power routing lines VRL are extended along the bending area BA and connected to corresponding pads of the pad area PA.

The dummy pattern DM may be positioned between the data link line DL and the power link line VL. The dummy pattern DM may be plural as shown, but the present disclosure is not limited thereto. The dummy pattern DM may be made of the same material as the gate electrode (GE of FIG. 2) of a transistor within the display area DA in a layer corresponding to the gate electrode (GE of FIG. 2). That is, the dummy pattern DM may be made of the same material as the data link line DL in a layer corresponding to the data link line DL.

Although not shown, the dummy pattern DM may be made of the same material as the source/drain electrodes (SE and DE of FIG. 2) of a transistor within the display area DA in a layer corresponding to the source/drain electrodes (SE and DE of FIG. 2). That is, the dummy pattern DM may be made of the same material as the data routing line DRL and the power routing line VRL in a layer corresponding to the data routing line DRL and the power routing line VRL.

Second Embodiment

Figure 11:
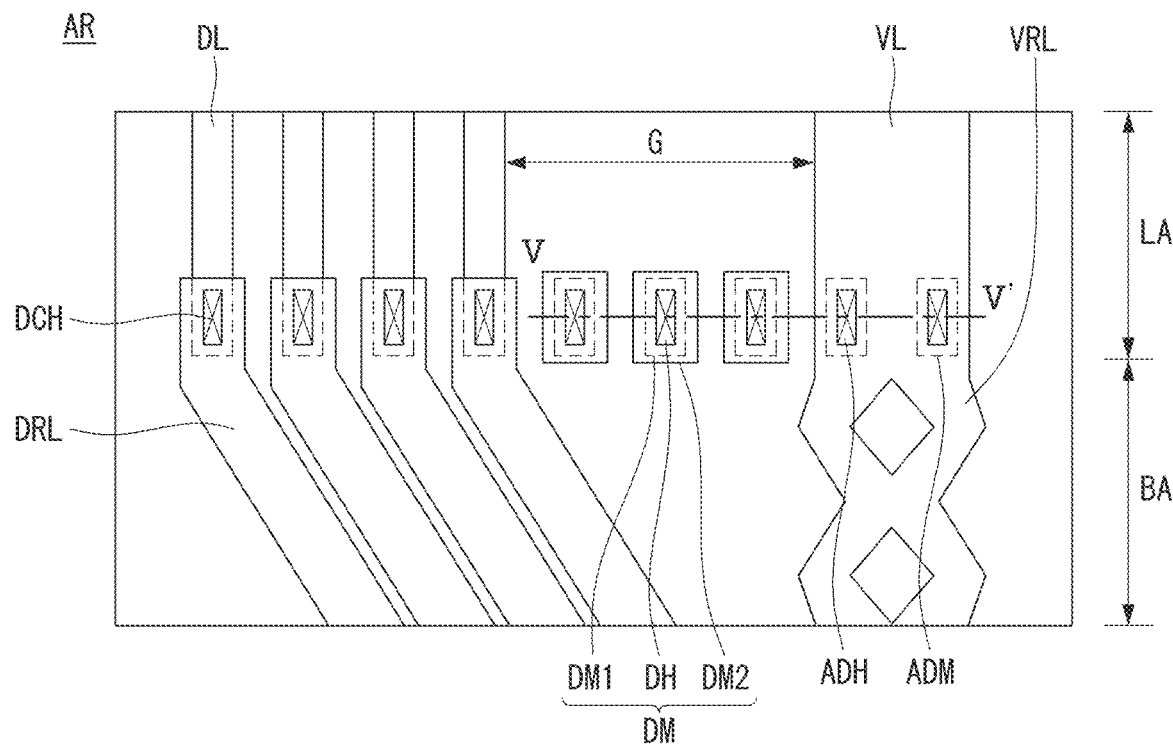
FIG. 11 is an enlarged plan view of the AR area of FIG. 3 according to a second embodiment of the present disclosure.
Figure 12:
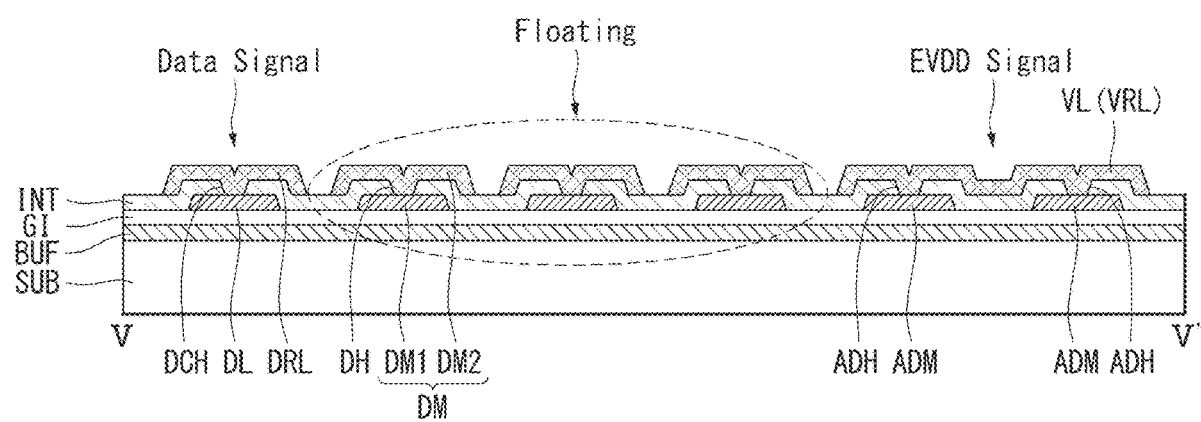
FIG. 12 is a cross-sectional view of FIG. 11, which is taken along line V-V.

FIG. 11 is an enlarged plan view of the AR area of FIG. 3 according to a second embodiment of the present disclosure. FIG. 12 is a cross-sectional view of FIG. 11, which is taken along line V-V'.

Referring to FIG. 11, a display device according to the second embodiment of the present disclosure includes a dummy pattern DM formed between a data link line DL and a power link line VL. The dummy pattern DM may be positioned in a link area LA and/or a bending area BA on which stress may be concentrated when the substrate SUB is bent. The dummy pattern DM is not connected to other signal lines, and any signal is not applied to the dummy pattern. That is, the dummy pattern DM is floated so that a specific signal is not applied thereto. The dummy pattern DM is made of a metal material, and compensates for a heat characteristic deviation between a substrate SUB and a buffer layer BUF in a temperature change environment during a process. Accordingly, the second embodiment of the present disclosure has an advantage in that it can provide a display device having an improved film lifting phenomenon.

The structure of the dummy pattern DM according to the second embodiment of the present disclosure is the same as the link structure (or stack structure) of the adjacent data link line DL and data routing line DRL. That is, the second embodiment of the present disclosure has an advantage in that it can provide a display device having enhanced design stability because it can secure design uniformity by forming the structure of the dummy pattern DM to have the same structure as the adjacent data link structure.

Furthermore, in order to further improve the design stability, an auxiliary dummy pattern ADM overlapping the power link line VL may be further formed. The link structure of the auxiliary dummy pattern ADM and the power link line VL may be the same as the data link structure and the dummy pattern structure.

Referring to FIG. 12, the buffer layer BUF and a gate insulating film GI are disposed over the substrate SUB. The data link line DL and the power link line VL are disposed on the gate insulating film GI. The data link line DL is positioned in the link area LA. The data link lines DL are extended from the data lines (D1~Dm of FIG. 1) of a display area DA.

The data link line DL may be made of the same material as the gate electrode (GE of FIG. 2) of a transistor within the display area DA in a layer corresponding to the gate electrode (GE of FIG. 2).

The data lines (D1~Dm of FIG. 1) may be connected to the data routing lines DRL via the data link lines DL disposed in a different layer. The data routing line DRL is positioned on the data link line DL with an interlayer insulating film INT interposed therebetween. The data routing line DRL is connected to the data link line DL through a data contact hole DCH penetrating the interlayer insulating film INT. The data routing line DRL is connected to the data link line DL in the link area LA. The data routing lines are extended along the bending area BA and connected to corresponding pads of the pad area PA. The data routing line DRL may be made of the same material as the source/drain electrodes (SE and DE of FIG. 2) of a transistor within the display area DA in a layer corresponding to the source/drain electrodes (SE and DE of FIG. 2).

The power link line VL is positioned on the interlayer insulating film INT. The power link line VL is positioned in accordance with the link area LA. The power link line VL is extended from the power lines (VD1~VDm of FIG. 1) and/or the power supply lines VDL1 and VDL2. The power link line VL may be made of the same material as the source/drain electrodes (SE and DE of FIG. 2) of a transistor within the display area DA in a layer corresponding to the source/drain electrodes (SE and DE of FIG. 2).

The power routing line VRL is connected to the power link line VL on the interlayer insulating film INT. The power routing line VRL may be part branched or extended from the power link line VL as one body along with the power link line VL. The power routing lines VRL are extended along the bending area BA and connected to corresponding pads of the pad area PA.

The dummy pattern DM may be positioned between the data link line DL and the power link line VL. The dummy pattern DM may be plural as shown, but is not limited thereto.

The structure of the dummy pattern DM may be the same as the link structure of the adjacent data link line DL and data routing line DRL. The dummy pattern DM may include a first dummy pattern DM1 and a second dummy pattern DM2.

The first dummy pattern DM1 may be made of the same material as the gate electrode (GE of FIG. 2) of a transistor within the display area DA in a layer corresponding to the gate electrode (GE of FIG. 2). That is, the first dummy pattern DM1 may be made of the same material as the data link line DL in a layer corresponding to the data link line DL. The second dummy pattern DM2 may be made of the same material as the source/drain electrodes (SE and DE of FIG. 2) of a transistor within the display area DA in a layer corresponding to the source/drain electrodes (SE and DE of FIG. 2). That is, the second dummy pattern DM2 may be made of the same material as the data routing line DRL and the power routing line VRL in a layer corresponding to the data routing line DRL and the power routing line VRL. The first dummy pattern DM1 and the second dummy pattern DM2 may be connected through a dummy contact hole DH that penetrates the interlayer insulating film INT interposed therebetween.

Furthermore, the display device according to the second embodiment of the present disclosure may further include an auxiliary dummy pattern ADM. The auxiliary dummy pattern ADM is positioned to overlap the power link line VL and electrically connected to the power link line VL, and may be supplied with power. The link structure of the auxiliary dummy pattern ADM and the power link line VL may be the same as the link structure of an adjacent data link line DL and data routing line DRL, and the structure of an adjacent dummy pattern DM.

The auxiliary dummy pattern ADM may be made of the same material as the gate electrode (GE of FIG. 2) of a transistor within the display area DA in a layer corresponding to the gate electrode (GE of FIG. 2). That is, the auxiliary dummy pattern ADM may be made of the same material as the data link line DL and the first dummy pattern DM1 in a layer corresponding to the data link line DL and the first dummy pattern DM1.

The auxiliary dummy pattern ADM and the power link line VL may be connected through an auxiliary dummy contact hole ADH that penetrates the interlayer insulating film INT interposed therebetween. Unlike the floated dummy pattern DM, the auxiliary dummy pattern ADM is electrically connected to the power link line VL and supplied with power.

Those skilled in the art will understand that the present disclosure may be changed and modified in various ways without departing from the technical spirit of the present disclosure through the above-described contents. Accordingly, the technical scope of the present disclosure is not limited to the contents described in the detailed description of the specification, but should be determined by the claims.

The various embodiments described above can be combined to provide further embodiments. Additional changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

What is claimed is:

1. A display device, comprising:
   a substrate including a display area in which pixels are arranged and a non-display area outside the display area;
   a plurality of gate lines and data lines in the display area;
   a data link line positioned in the non-display area to deliver a signal to the pixels;
   a power link line spaced apart from the data link line at a selected distance in the non-display area to deliver power to the pixels; and
   a dummy pattern positioned between the data link line and the power link line in the non-display area compensate heat characteristic deviation between the substrate and a buffer layer, the dummy pattern having a first dummy pattern and a second dummy pattern,
   wherein the data link line and the first dummy pattern are disposed on the buffer layer, and the data routing line and the second dummy pattern are disposed on an insulating layer,
   wherein the data link line and the data routing line are connected through a first contact hole in the insulating layer, and the first dummy pattern and the second dummy pattern are connected through a second contact hole in the insulating layer, wherein the data link line, the power link line, and the dummy pattern are comprised of a metal, and wherein the dummy pattern is electrically disconnected from the data link line and the power link line.

2. The display device of claim 1, wherein the dummy pattern includes a metal material.

3. The display device of claim 1, further comprising:
a pad connected to the data link line in the non-display area.

4. The display device of claim 1, further comprising an auxiliary dummy pattern overlapping the power link line at a layer corresponding to the data link line and the dummy pattern, and the auxiliary dummy pattern is comprised of metal, wherein the auxiliary dummy pattern is electrically connected to the power link line through an auxiliary dummy contact hole penetrating the insulating layer.

5. The display device of claim 4, wherein:
the dummy pattern is electrically floated; and
the auxiliary dummy pattern is supplied with the power from the power link line.

6. The display device of claim 1, further comprising a power routing line extended from the power link line,
wherein the non-display area includes:
a link area in which the data link line and the power link line are disposed and a data contact hole connecting the data link line and the data routing line is positioned;
a bending area along which the data routing line and the power routing line are extended; and
a pad area in which the pad is disposed, and
wherein the substrate is configured to be bent toward the back of the display device at the bending area.

7. The display device of claim 6, wherein the dummy pattern is positioned at the link area.

8. The display device of claim 6, further comprising an open hole penetrating at least one of insulating layers interposed between the data routing line or the power routing line and the substrate, and the open hole disposed in the bending area.

9. The display device of claim 6, wherein at least one of the data routing line and the power routing line has a plane shape of a zigzag in the bending area.

10. The display device of claim 6, wherein at least one of the data routing line or the power routing line has a shape branched in a plurality of patterns in the bending area.

11. A display device, comprising:
a substrate having thereon a display area in which pixels are arranged and a non-display area adjacent to the display area;
a plurality of data link lines arranged at the non-display area;
a plurality of data routing lines connecting the data link lines in the non-display area:
a power link line spaced apart from the plurality of data link lines at a selected distance at the non-display area on the buffer layer; and
a plurality of dummy patterns positioned between the plurality of data link lines and the power link line to compensate heat characteristic deviation between the substrate and a buffer layer, each of the dummy patterns having a first dummy pattern and a second dummy pattern,
wherein the plurality of data link lines and the plurality of first dummy patterns are disposed on the buffer layer, and the plurality of data routing lines and the plurality of second dummy patterns are disposed on an insulating layer,
wherein the data link lines and the data routing lines are respectively connected through a first contact hole in the insulating layer, and the first dummy patterns and the second dummy patterns are respectively connected through a second contact hole in the insulating layer,
wherein the data link line and the power link line are comprised of a metal, and
wherein the dummy patterns are electrically disconnected from the plurality of data link lines and the power link line.

12. The display device of claim 11, further comprising:
a plurality of auxiliary dummy patterns, the auxiliary dummy patterns being electrically connected to the power link line and overlaps the power link line.

13. The display device of claim 12, wherein the auxiliary dummy patterns are comprised of the metal.

* * * * *

UNITED STATES PATENT AND TRADEMARK OFFICE
CERTIFICATE OF CORRECTION

| | | |
|---|---|---|
| PATENT NO. | : 11,263,978 B2 | Page 1 of 1 |
| APPLICATION NO. | : 16/583030 | |
| DATED | : March 1, 2022 | |
| INVENTOR(S) | : Boeun Jo et al. | |

It is certified that error appears in the above-identified patent and that said Letters Patent is hereby corrected as shown below:

In the Claims

<u>Column 16, Claim 11, Line 12:</u>
"area:" should read: -- area; --.

<u>Column 16, Claim 11, Lines 14-15:</u>
"non-display area on the buffer layer; and" should read: -- non-display area; and --.

Signed and Sealed this
Third Day of October, 2023

Katherine Kelly Vidal
*Director of the United States Patent and Trademark Office*